(12) United States Patent
Tago et al.

(10) Patent No.: US 8,916,976 B2
(45) Date of Patent: Dec. 23, 2014

(54) SEMICONDUCTOR DEVICE AND METHOD OF MANUFACTURING THE SAME

(75) Inventors: Masamoto Tago, Tokyo (JP); Yoichiro Kurita, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/053,351

(22) Filed: Mar. 21, 2008

(65) Prior Publication Data
US 2008/0237883 A1 Oct. 2, 2008

(30) Foreign Application Priority Data
Mar. 30, 2007 (JP) .................. 2007-092462

(51) Int. Cl.
| H01L 23/52 | (2006.01) |
| H01L 23/00 | (2006.01) |
| H01L 25/065 | (2006.01) |
| H01L 25/00 | (2006.01) |
| H01L 23/31 | (2006.01) |

(52) U.S. Cl.
CPC ............ *H01L 23/3128* (2013.01); *H01L 24/73* (2013.01); *H01L 2924/01006* (2013.01);
(Continued)

(58) Field of Classification Search
USPC .................. 257/777, 774, E21.001, E23.141; 438/123
See application file for complete search history.

(56) References Cited

U.S. PATENT DOCUMENTS

| 5,777,386 A * | 7/1998 | Higashi et al. ............... 257/737 |
| 6,847,104 B2 * | 1/2005 | Huang et al. ................. 257/685 |

(Continued)

FOREIGN PATENT DOCUMENTS

| JP | 2001-94045 A | 4/2001 |
| JP | 200360154 A | 2/2003 |

(Continued)

OTHER PUBLICATIONS

Office Action issued Feb. 29, 2012 in corresponding Japanese application No. 2007-092462.

*Primary Examiner* — Samuel Gebremariam
(74) *Attorney, Agent, or Firm* — Sughrue Mion, PLLC

(57) ABSTRACT

First semiconductor element 1 being buried in first insulating material 2; second semiconductor element 5 being covered by second insulating material 6; connection electrode 4 being buried in first insulating material 2 arranged between circuit surface of first semiconductor element 1 and circuit surface of second semiconductor element 5; external connection terminal 8 being arranged on lower surface of first insulating material 2 facing in the same direction as lower surface of first semiconductor element 1 opposite to circuit surface thereof; connection electrode 4 forming a part of path for electrically connecting circuit surface of first semiconductor element 1 and circuit surface of second semiconductor element 5 to each other; first semiconductor element 1 and external connection terminal 8 being electrically connected to each other by way of wire 3 and via 7 passing through region of insulating layer other than region thereof burying connection electrode 4.

5 Claims, 19 Drawing Sheets

(52) U.S. Cl.
CPC ............ *H01L 2225/06517* (2013.01); *H01L 2924/01005* (2013.01); *H01L 2924/01078* (2013.01); *H01L 2924/18161* (2013.01); H01L 25/0657 (2013.01); *H01L 2924/01082* (2013.01); *H01L 2225/06513* (2013.01); *H01L 2224/24226* (2013.01); H01L 25/50 (2013.01); *H01L 2224/48227* (2013.01); *H01L 2924/01033* (2013.01); *H01L 24/48* (2013.01); *H01L 24/16* (2013.01); *H01L 2224/48091* (2013.01); *H01L 2924/01079* (2013.01); *H01L 2224/16145* (2013.01); *H01L 2224/45147* (2013.01); H01L 24/96 (2013.01); *H01L 2225/0651* (2013.01); *H01L 2221/68359* (2013.01); *H01L 2224/76155* (2013.01); *H01L 2924/10253* (2013.01); *H01L 2924/15311* (2013.01); *H01L 2924/1532* (2013.01); *H01L 2924/01029* (2013.01); *H01L 2225/06524* (2013.01); *H01L 2224/82039* (2013.01)

USPC ............ 257/774; 257/777; 257/E21.001; 257/E23.141

(56) References Cited

U.S. PATENT DOCUMENTS

| | | | |
|---|---|---|---|
| 2003/0215993 A1* | 11/2003 | Oshima | 438/200 |
| 2005/0205978 A1* | 9/2005 | Pu et al. | 257/678 |
| 2006/0012026 A1* | 1/2006 | Kang et al. | 257/697 |
| 2006/0063312 A1* | 3/2006 | Kurita | 438/127 |
| 2007/0023906 A1* | 2/2007 | Kurita et al. | 257/737 |

FOREIGN PATENT DOCUMENTS

| | | |
|---|---|---|
| JP | 2003243604 A | 8/2003 |
| JP | 2003332508 A | 11/2003 |
| JP | 2006-19433 A | 1/2006 |

* cited by examiner

FIG.13D
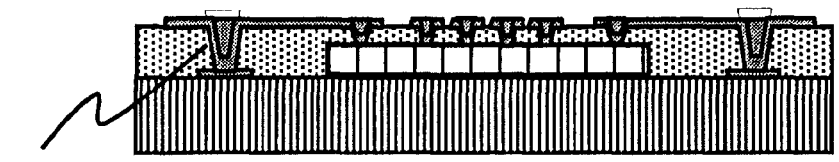
7
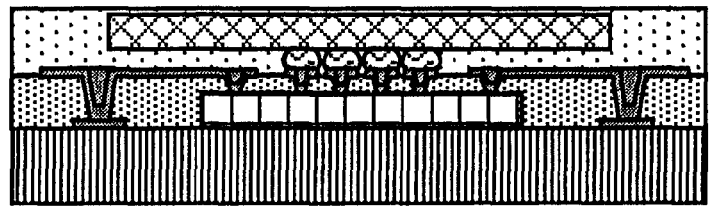
FIG.13E
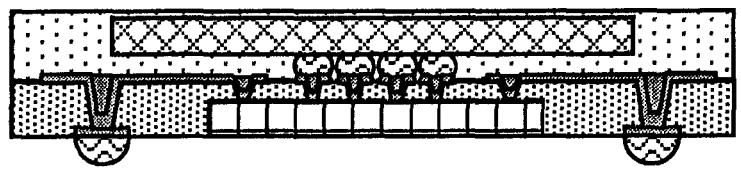
FIG.13F

FIG.15D
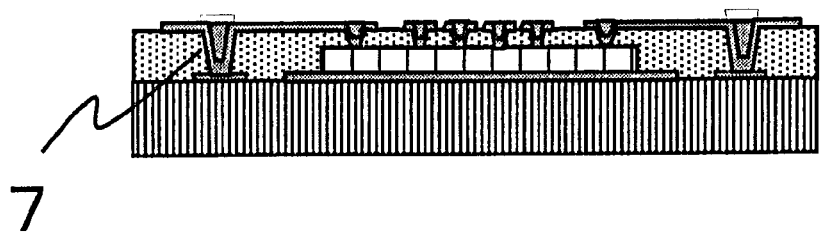
7
FIG.15E
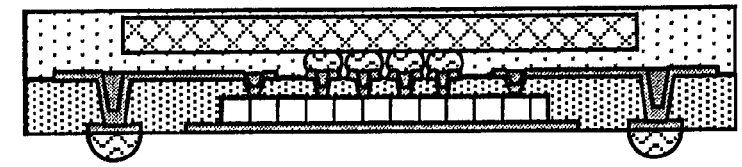
FIG.15F

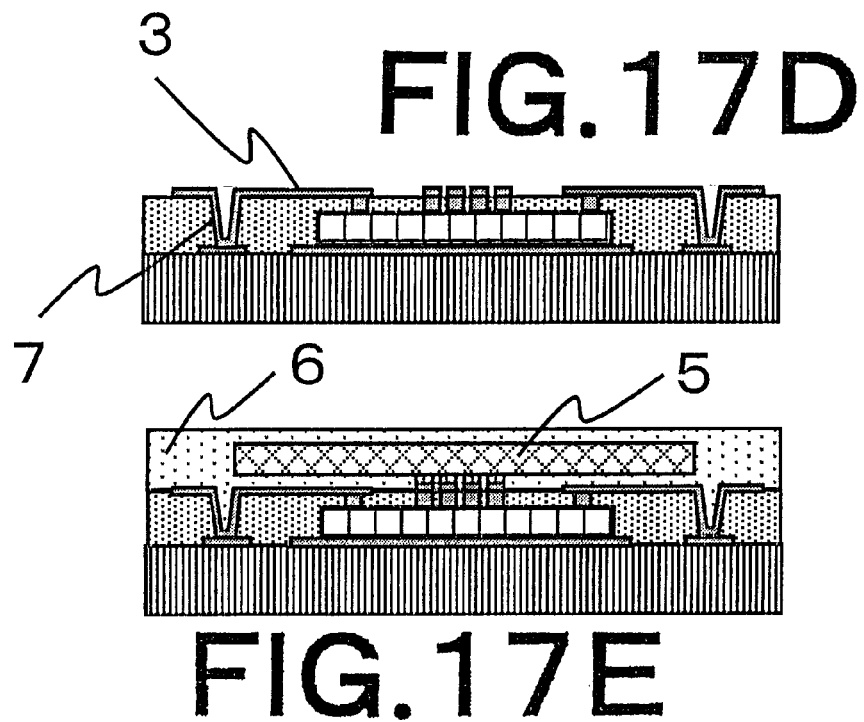
FIG. 17D
FIG. 17E
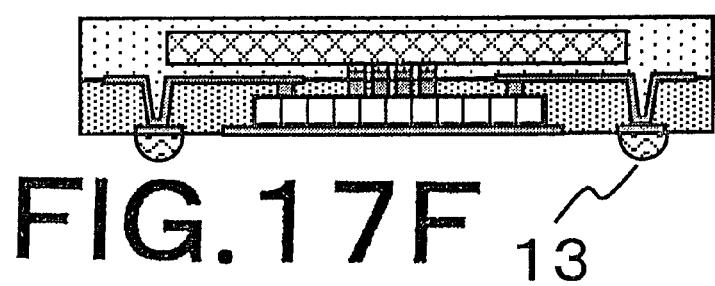
FIG. 17F

FIG.18A
FIG.18B
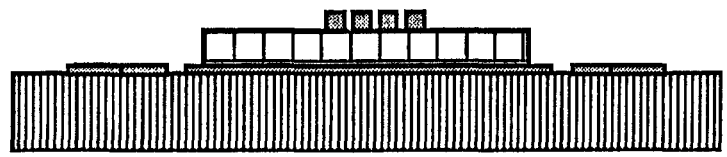
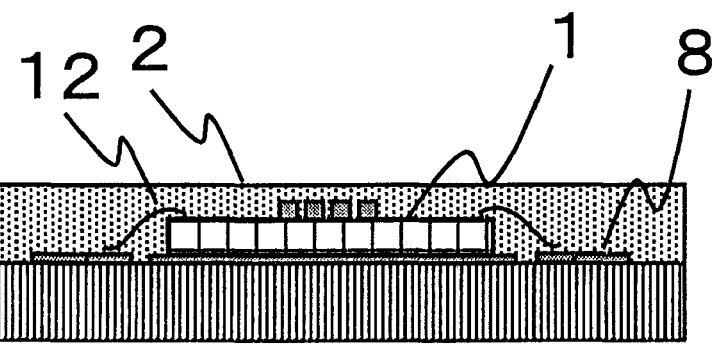
FIG.18C

FIG.19A
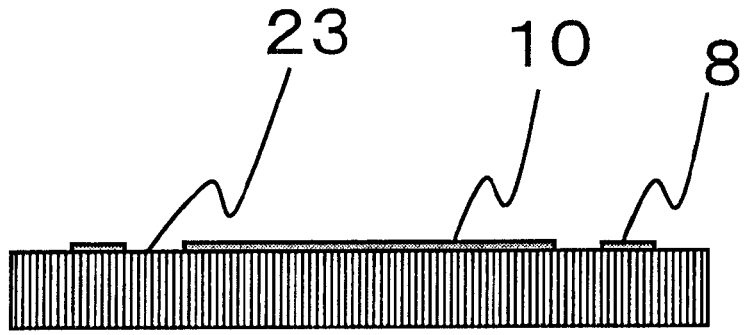
FIG.19B
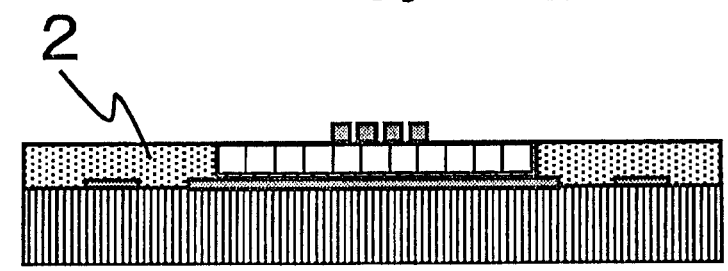
FIG.19C

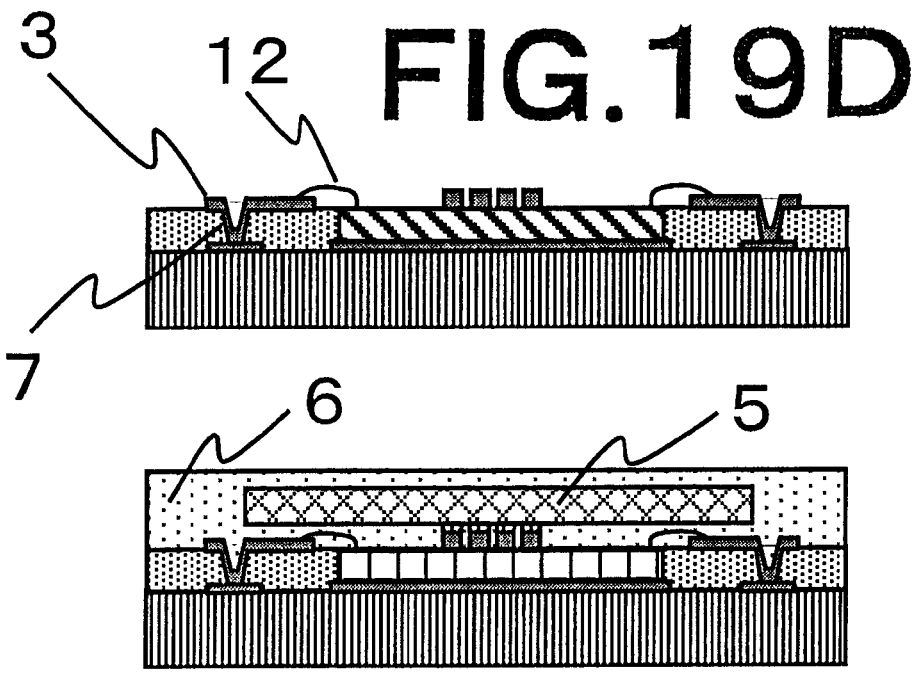
FIG.19D
FIG.19E
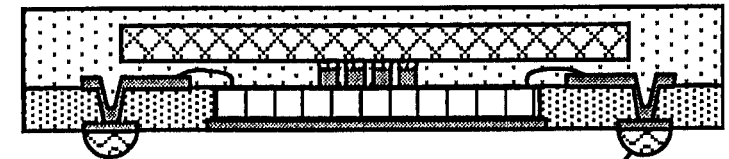
FIG.19F

SEMICONDUCTOR DEVICE AND METHOD OF MANUFACTURING THE SAME

BACKGROUND OF THE INVENTION

1. Field of the Invention

This invention relates to a semiconductor device and a method of manufacturing the same. More particularly, the present invention relates to a semiconductor device having a plurality of semiconductor elements and a method of manufacturing the same.

2. Description of the Related Art

Chip-on-chip type semiconductor devices have been developed as a result of technological developments in recent years. For instance, Patent Document 1 (JP-A-2006-19433; especially FIGS. 1 through 4 and 31) describes a semiconductor device having a structure where a wiring layer is supported by a silicon layer operating as support layer for supporting the wiring layer to thereby form a flat plate-shaped wiring member, a through electrode is formed in the flat plate-shaped wiring member so as to run through the wiring layer and support layer, and semiconductor elements are mounted on the opposite surfaces of the wiring member with the through electrode interposed therebetween. Here, conductor through holes that are provided to perform connection with the respective external connection terminals are buried in sealing resin that is applied so as to cover the lateral surfaces of the semiconductor element mounted on one of the surfaces of the wiring member.

Additionally, the structure of the semiconductor device disclosed in Patent Document 1 is such that the semiconductor elements mounted on the opposite surfaces of the wiring member are connected with each other by way of the through electrode and one of the semiconductor elements is mounted on an electrode forming surface where solder balls are formed as the external connection terminals.

The known semiconductor device disclosed in Patent Document 1 is manufactured in the following manner. Firstly, a semiconductor chip is mounted in a face-down manner on a wiring member formed on a support substrate and sealed by resin along with conductor through holes. The support substrate is removed after removing the sealing resin to expose the surfaces of the conductor through holes. As the support substrate is removed, the through electrode for connecting semiconductor elements with each other becomes exposed so that another semiconductor element is mounted on the through electrode in a face-down manner to produce a semiconductor device.

However, a semiconductor device disclosed in Patent Document 1 is accompanied by the following problems.

The first problem is that a silicon layer is used as the support layer in the wiring member. While silicon etching or RIE may be used to form a through electrode running through the wiring layer and support layer, the use of such a technique raises the cost of manufacturing the semiconductor device.

Additionally, the manufacturing process is complex and cumbersome to further raise the manufacturing cost. More specifically, conductor through holes for connecting with external connection terminals need to be formed on the wiring member in advance and the manufacturing step that comes after mounting semiconductor elements and sealing with resin to grind and remove the sealing resin in order to use the conductor through holes as electrodes involves a step of exposing a metal surface. Both metal and resin need to be ground at the same time in this step so that fine metal fragments can be scattered on the resin surface to give rise to short-circuiting between the electrodes.

The second problem is that a semiconductor element is mounted on the electrode forming surface where solder balls are formed as external connection terminals. When mounting such a package on a motherboard, the height of the solder balls of the external connection terminals has to be determined by taking thickness of the mounted semiconductor element into account. Then, the amount of solder needs to be increased so that by turn the diameter of the electrodes has to be raised to make it impossible to arrange terminals at a small pitch. When, on the other hand, terminals are arranged at a small pitch without increasing the amount of solder, the semiconductor element may become in contact with the motherboard to give rise to a defective connection on the part of the solder.

Additionally, while both of the two semiconductor elements are mounted so as to face down relative to the wiring member, the through electrodes located in the areas for connecting chips to each other are arranged at a fine pitch so that the high precision flip chip mounting operation has to be conducted twice to consequently reduce the manufacturing yield factor. The time that needs to be spent for alignment is inevitably long due to the high precision mounting to consequently raise the manufacturing cost.

SUMMARY OF THE INVENTION

According to the present invention, there is provided a semiconductor device having a first semiconductor element and a second semiconductor element with their respective circuit surface sides located vis-à-vis relative to each other;

the first semiconductor element being buried at least at a part of the lateral surface thereof in a first insulating material;

the second semiconductor element being covered at least at the circuit surface thereof by a second insulating material;

a connection electrode being buried in an insulating layer arranged between the circuit surface of the first semiconductor element and the circuit surface of the second semiconductor element;

an external connection terminal being arranged on the surface of the first insulating material facing in the same direction as the surface of the first semiconductor element opposite to the circuit surface thereof;

the connection electrode forming at least a part of a path for electrically connecting the circuit surface of the first semiconductor element and the circuit surface of the second semiconductor element to each other;

the first semiconductor element and the external connection terminal being electrically connected to each other by way of a conducting member passing through a region of the insulating layer other than a region thereof burying the connection electrode.

In an aspect of the present invention, the conducting member passes through the first insulating material.

In an aspect of the present invention, the insulating layer includes at least a part of the first insulating material. In an aspect of the present invention, the conducting member includes a wire arranged along the interface of the first insulating material and the second insulating material, and a via buried in the first insulating material. In an aspect of the present invention, the conducting member includes a bonding wire buried in the first insulating material. In an aspect of the present invention, the conducting member includes a metal projection fitted to the first semiconductor element, a wire arranged along the interface of the first insulating material and the second insulating material, and a via buried in the first insulating material.

In an aspect of the present invention, the insulating layer is formed by at least a part of the second insulating material. In an aspect of the present invention, the conducting member includes a bonding wire buried in the second insulating material, a wire arranged along the interface of the first insulating material and the second insulating material, and a via buried in the first insulating material.

In an aspect of the present invention, the via is filled with metal. In an aspect of the present invention, the connection electrode is made of a metal projection fitted to the first semiconductor element. In an aspect of the present invention, a metal plate is fitted to the surface of the first semiconductor element opposite to the circuit surface thereof. In an aspect of the present invention, the metal plate is buried at least at a part of the lateral surface thereof in the first insulating material. In an aspect of the present invention, the metal plate operates also as wiring layer.

According to the present invention, there is also provided a method of manufacturing the above semiconductor device, comprising:

a step of forming the external connection terminal on a support substrate;

a step of arranging the first semiconductor element so as to face up on the support substrate in a region different from a region for forming the external connection terminal;

a step of burying at least a part of the lateral surface of the first semiconductor element and the external connection terminal in the first insulating material;

a step of forming at least a part of the conducting member in the first insulating material;

a step of connecting the second semiconductor element, by making it face down, to the first semiconductor element by way of the connection electrode;

a step of covering at least the circuit surface of the second semiconductor element by means of the second insulating material; and a step of removing the support substrate.

In an aspect of the present invention, the connection electrode is formed in the step of forming at least a part of the conducting member in the first insulating material. In an aspect of the present invention, a metal plate is formed on the support substrate in the region different from the region for forming the external connection terminal in the step of forming the external connection terminal on the support substrate. In an aspect of the present invention, a bonding wire is formed for electrically connecting at least a part of the conducting member and the first semiconductor element to each other, after the step of forming at least a part of the conducting member in the first insulating material.

According to the present invention, there is also provided a method of manufacturing the above semiconductor device, comprising:

a step of forming the external connection terminal and a metal plate on a support substrate;

a step of arranging the first semiconductor element so as to face up on the metal plate:

a step of forming a bonding wire for electrically connecting the first semiconductor element and the external connection terminal to each other;

a step of burying at least a part of the lateral surface of the first semiconductor element, the external connection terminal, and the bonding wire in the first insulating material;

a step of connecting the second semiconductor element, by making it face down, to the first semiconductor element by way of the connection electrode;

a step of covering at least the circuit surface of the second semiconductor element by means of the second insulating material; and a step of removing the support substrate.

In an aspect of the present invention, wherein a metal projection is fitted to the circuit surface of the first semiconductor element in advance, and the surface of the metal projection is exposed after the step of burying in the first insulating material so as to use the metal projection as the connection electrode in the step of connecting the second semiconductor element to the first semiconductor element.

The first advantage of the present invention is that, since the connection electrode for electrically connecting the first semiconductor element to the second semiconductor element is formed on the first semiconductor element mounted on the support substrate so as to face up, the width of the bus for connecting chips to each other can be broadened so that a highly reliably, low cost, downsized and thin semiconductor device that can transmit signals at high speed and a method of manufacturing such a semiconductor device can be provided.

The second advantage of the present invention is that, since the first semiconductor element is mounted so as to face up and not to project from the external connection terminal, the pitch of arrangement of electrodes can be made very small and a high standoff can be provided to suppress any possible fall of reliability that can arise as a result of short-circuiting to neighboring terminals. Additionally, when the semiconductor device is mounted on a motherboard, the risk that the bottom surface of the semiconductor device touches the motherboard is reduced so that a semiconductor device showing a high reliability for secondary mounting can be provided.

The third advantage of the present invention is that the operation of forming the conducting member such as the wire on the support substrate, that of mounting the semiconductor elements and that of sealing with resin are conducted continuously so that the method of manufacturing the semiconductor device according to the present invention is made to have a simplified process. Rules for forming micro wires can be applied to improve the wiring density by using a very flat support substrate. Additionally, the semiconductor device can be mounted highly accurately by using the support substrate having a small thermal expansion coefficient.

A single step is used to mount the semiconductor element to face down relative to wires and no through via need to be formed so that a structure for densely mounting the semiconductor elements on the opposite surfaces can be realized to improve the manufacturing yield factor and reduce both the manufacturing time and the manufacturing cost.

The present invention can be applied to semiconductor devices to be used portable terminal equipment, network equipment and computers adapted to process high definition moving images at high speed.

BRIEF EXPLANATION OF THE DRAWINGS

FIGS. 13A through 13F are process diagrams showing the method of manufacturing the semiconductor device of the first embodiment according to the present invention;

FIGS. 15A through 15F are process diagrams showing the method of manufacturing the semiconductor device of the second embodiment according to the present invention;

FIGS. 17A through 17F are process diagrams showing the method of manufacturing the semiconductor device of the third embodiment according to the present invention;

FIGS. 18A through 18F are process diagrams showing the method of manufacturing the semiconductor device of the fourth embodiment according to the present invention; and FIGS. 19A through 19F are process diagrams showing the method of manufacturing the semiconductor device of the fifth embodiment according to the present invention.

DETAILED DESCRIPTION OF THE PREFERRED EMBODIMENTS

Now, the present invention will be described in greater detail by referring to the accompanying drawings that illustrate preferred embodiments of the invention.

First Embodiment

Figure 1:
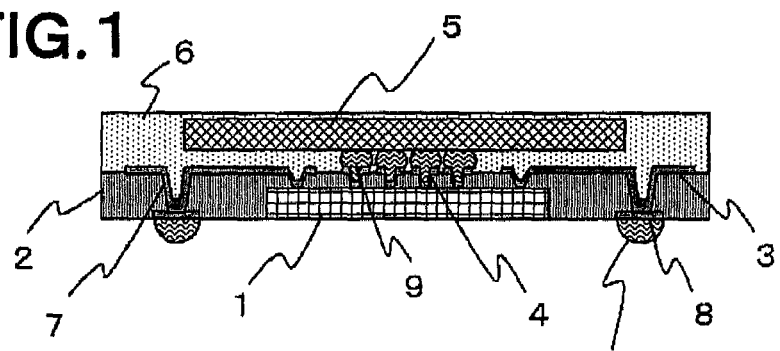
FIG. 1 is a schematic cross sectional view of a first embodiment of a semiconductor device according to the present invention.

FIG. 1 is a schematic cross sectional view of the first embodiment of semiconductor device according to the present invention. A first semiconductor element 1 is mounted so as to face up and side by side with a pair of external connection terminals 8 on each of which an external connection solder 13 is arranged. The first semiconductor element 1 is insulated from the surrounding by a first insulating material (first insulating material portion) 2.

Wires 3 for electrically connecting the external connection terminals 8 to the first semiconductor element 1 and a connection electrode 4 for electrically connecting the first semiconductor element 1 to a second semiconductor element 5 are formed on the first insulating material 2. The first semiconductor element 1 and the second semiconductor element 5 are electrically and mechanically connected to each other with their circuit surfaces facing each other with use of bumps 9 interposed between them. The connecting sections including the bumps 9 are sealed and protected by a second insulating material (second insulating material portion) 6.

Thus, at least a part of the lateral surface of the first semiconductor element 1 is buried in the first insulating material 2, and at least the circuit surface of the second semiconductor element 5 is covered by the second insulating material 6. The connection electrode 4 is buried in the insulating layer arranged between the circuit surface of the first semiconductor element 1 and the circuit surface of the second semiconductor element 5. In this embodiment, the insulating layer includes at least a part of the first insulating material 2. An external connection terminal 8 is arranged on the surface (lower surface) of the first insulating material 2 that is facing in the same direction (downward) as the surface (lower surface) of the first semiconductor element opposite to the circuit surface (upper surface) thereof. The connection electrode 4 forms a part of a path for electrically connecting the circuit surface of the first semiconductor element 1 and the circuit surface (lower surface) of the second semiconductor element 5 to each other. In this embodiment, the above electrical path is formed by the connection electrode 4 and bumps 9. The first semiconductor element 1 and the external connection terminals 8 are electrically connected to each other by way of conducting members passing through the respective regions of the insulating layer other than a region thereof where the connection electrode 4 is buried. In this embodiment, the conducting members include the wires 3 arranged along the interface of the first insulating material 2 and the second insulating material 6 and vias 7 buried in the first insulating material 2. In other words, the conducting members also pass through the first insulating material 2.

As the first semiconductor element 1 is mounted at a lateral side of the external connection terminals 8 on which the external connection solders 13 are arranged respectively, the first semiconductor element 1 is structurally buried in the first insulating material 2 so that the first semiconductor element 1, which was mounted on a wiring member so as to project by the total thickness thereof in the conventional case, is not required to project at the side of the external connection solders 13. In other words, the external connection solders 13 are not required to have a large height so as to be outstanding from the chip. Then, the risk that the external connection solders 13 short-circuit to the respective neighboring ones is reduced to allow the external connection solders 13 to be arranged at a fine pitch. Additionally, the semiconductor device can have a high standoff to improve the reliability thereof for the temperature cycle.

Any solder that is electrically conductive and can be bonded to an external substrate may be used for the external connection solders 13. Examples of solders that can be used for the purpose of the present invention include Pb—Sn solders, lead-free solders and conductive adhesives. The external connection solders 13 preferably have a bump-like profile. The first insulating material 2 may be selected from photosensitive resins, non-photosensitive and thermosetting resins and thermoplastic resins. The second insulating material 6 is preferably an epoxy resin that is a thermosetting resin, although it may alternatively be a thermoplastic resin or a photosensitive resin. The first insulating material 2 and the second insulating material 6 may be the same material. The second insulating material 6 may be a combination of a resin material for sealing the gap between the chip (the second semiconductor element 5) and the wires and another resin material for sealing the remaining part of the second semiconductor element 5 that is different from the former resin material.

While the surface (the lower surface) of the first semiconductor element 1 that is opposite to the circuit surface thereof is flush with the external connection terminals 8 in FIG. 1, the lower surface of the first semiconductor element 1 may be recessed slightly from the external connection terminals 8. Conversely, the lower surface of the first semiconductor element 1 may be protruding slightly from the external connection terminals 8, while the protrusion of the first semiconductor element 1 is preferably not more than a half of the thickness of the semiconductor device 1 when the height of the external connection solders 13 is taken into account.

Figure 2:
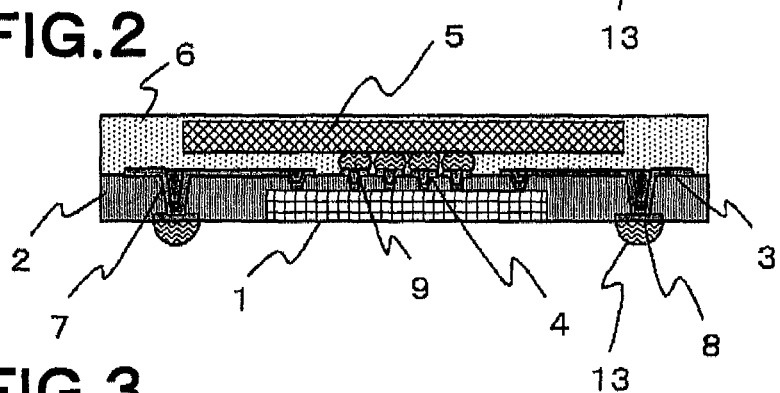
FIG. 2 is a schematic cross sectional view of the first embodiment of the semiconductor device according to the present invention.

While the vias 7 are not filled with metal in FIG. 1, a via 7 that is filled with metal as shown in FIG. 2 may be used with an unfilled via in combination. Any possible generation of voids can be suppressed when sealing the vias 7 with an insulating material 6 provided that the vias 7 are filled with metal. While a single layer of wires 3 is formed in this embodiment, the wiring density can be improved when a filled via 7 is appropriately combined with an unfilled via 7. The advantage of such a combination can be optimally exploited when each of the wires 3 is formed as a multilayer.

Now, the method of manufacturing the semiconductor device of the first embodiment will be described by referring to FIGS. 12A through 12F.

Figure 12A:
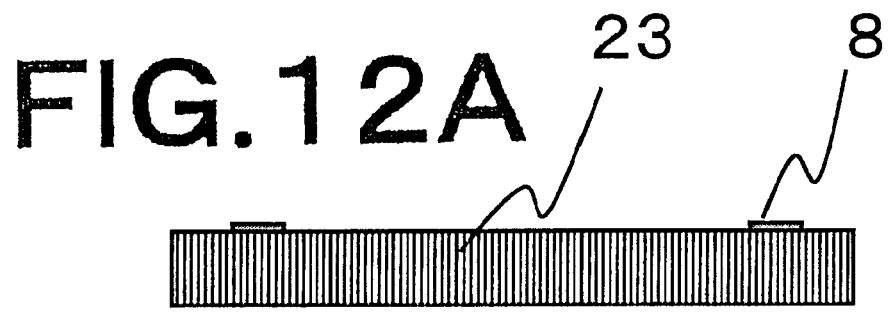
FIGS. 12A through 12F are process diagrams showing a method of manufacturing the semiconductor device of the first embodiment according to the present invention.
Figure 12B:
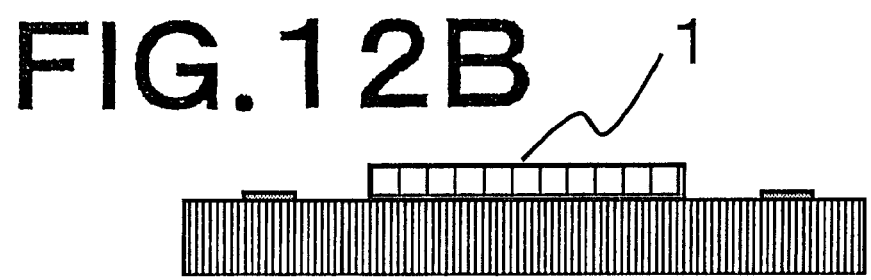
Figure 12C:
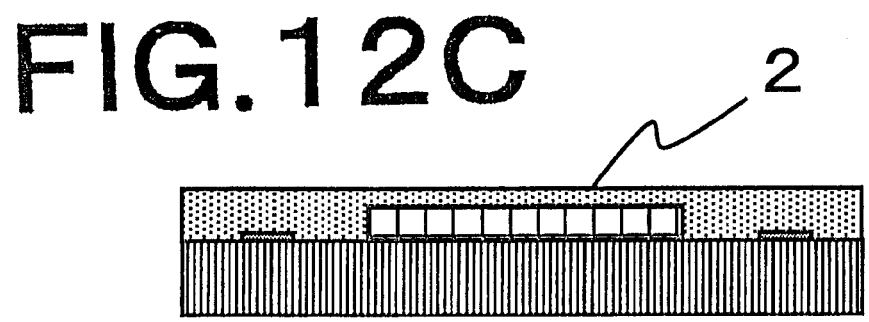
Figure 12D:
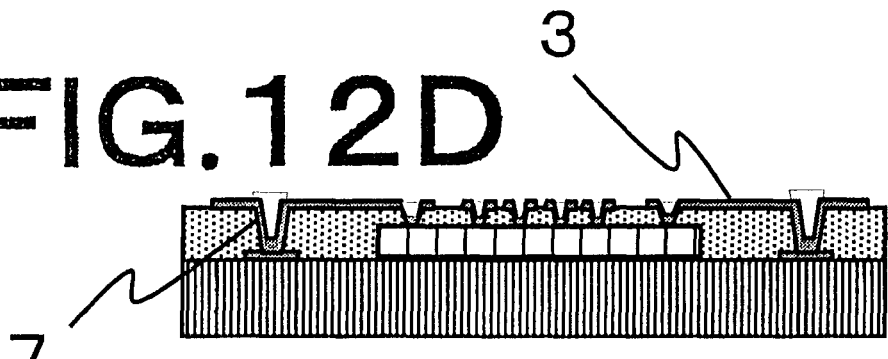
Figure 12E:
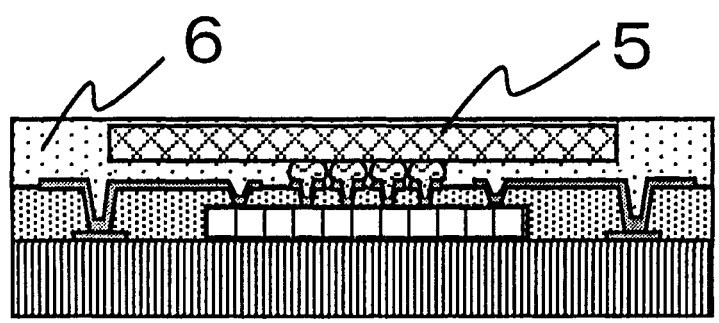

Firstly, external connection terminals 8 are formed on a support substrate 23 by plating (FIG. 12A). Then, a first semiconductor element 1 is mounted to face up so as to provide a high positional accuracy relative to the external connection terminals 8 (FIG. 12B). Thereafter, a first insulating material 2 is arranged to bury the first semiconductor element 1 and the external connection terminals 8 (FIG. 12C). Subsequently, holes through the first insulating material 2 are made at positions corresponding to the external connection terminals 8 and the connecting parts (electrodes) on the first semiconductor element 1, and then wires 3, vias 7 and a connection electrode 4 are formed by plating (FIG. 12D). Then, a second semiconductor element 5 associated with solder bumps formed thereon is mounted to face down and the gap between the second semiconductor element 5 and the wires 3 is filled with a second insulating material 6, while the exposed parts of the first insulating material 2, wires 3 and second semiconductor element 5 are covered also by the second insulating material 6 to consequently cover the entire structure formed on the support substrate 23 (FIG. 12E). The gap between the chip of second semiconductor element 5 and the wires 3 may be sealed by the second insulating material 6 by means of a technique of transversally flowing with liquid resin that operates as the second insulating material 6 after mounting the chip or a technique of feeding the chip mounting area with a liquid or sheet-shaped material that operates as the second insulating material 6 and conducting the operation of electrode bonding and that of setting the resin concurrently when mounting the chip.

Figure 12F:
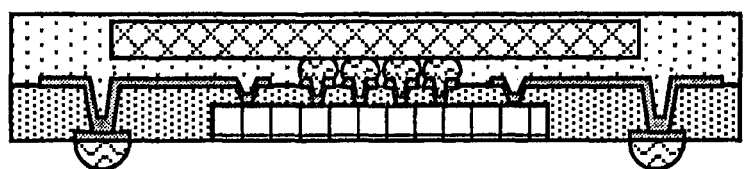

Thereafter, the support substrate 23 is removed to expose the external connection terminals 8. Subsequently, solder bumps are formed by external connection solders 13 and the device is diced to complete the manufacturing process (FIG. 12F).

Thus, the method of manufacturing a semiconductor device of this embodiment comprises:

a step of forming the external connection terminals 8 on a support substrate 23;

a step of arranging the first semiconductor element 1 so as to face up on the support substrate 23 in a region different from regions for forming the external connection terminals 8;

a step of burying at least a part of the lateral surface of the first semiconductor element 1 and the external connection terminals 8 in the first insulating material 2;

a step of forming wires 3, vias 7 and a connection electrode 4 as at least a part of the conducting member in the first insulating material 2;

a step of connecting the second semiconductor element 5, by making it face down, to the first semiconductor element 1 by way of the connection electrode 4;

a step of covering at least the circuit surface of the second semiconductor element 5 by means of the second insulating material 6; and a step of removing the support substrate 23.

The support substrate 23 is preferably made of a material that provides it with characteristics including an excellent degree of flatness and a thermal expansion coefficient that makes it free from deformations due to thermal expansion and other causes and is equal to or close to the thermal expansion coefficient of the first semiconductor element 1 and that of the second semiconductor element 5. With the above-described embodiment, all the manufacturing process is conducted with the support substrate fitted to the device. Then, the operation of forming the external connection terminals 8, wires 3, vias 7 and connection electrode 4, that of mounting the first semiconductor element 1 and that of mounting the second semiconductor element 5 can be carried out to a high degree of precision by using such a support substrate 23. The step of forming vias 7 in the first insulating material 2 can be carried out collectively over a large number of semiconductor devices by photolithography when a photosensitive resin material is selected for the first insulating material 2, whereby the efficiency of this manufacturing process is high.

A number of connection electrodes 4 can be collectively formed to electrically connect the first semiconductor devices 1 and the second semiconductor devices 5 to each other for so many semiconductor devices in the wire forming step, to thereby simplify the step of forming the connection electrode 4 for use in electrically connecting the semiconductor elements to each other. Then, semiconductor devices can be manufactured at low cost.

Other techniques that can be used for forming the wires 3 include sputtering, vapor deposition, paste printing and ink jet (paste) printing.

In the manufacturing method illustrated in FIGS. 12A through 12F, the operations of mounting the first semiconductor element 1, forming the wires 3 and connecting the wires and the external connection terminals 8 to each other, forming the connection electrode 4 and connecting the first semiconductor element 1 and the second semiconductor element 5 to each other by way of the connection electrode can be collectively conducted to make it possible to simplify the manufacturing process and achieve a high manufacturing yield factor. This manufacturing method is characterized firstly by mounting the first semiconductor element 1 on the support substrate 23 so as to face up. The mounting precision is improved and the possibility of connection failure is minimized as the first semiconductor element 1 is mounted so as to face up. Since the step of collectively forming wires for a number of first semiconductor elements 1 mounted over an entire wafer is simple and a wafer process is employed, a wire density and a wiring accuracy higher than the ordinary wiring process on an organic substrate can be realized. Subsequently, the second semiconductor element 5 is mounted on the first semiconductor element 1 so as to face down and the gap between the semiconductor elements is sealed by a second insulating material 6 before the support substrate 23 is ultimately removed to form the external connection terminals 8. Thus, the entire manufacturing process is simplified and the number of manufacturing steps is reduced.

Techniques that are currently being applied to semiconductor device manufacturing processes such as grinding and etching can be used for removing the support substrate 23. The support substrate 23 is made reusable when a peeling layer is formed on the support substrate 23 in advance and the support substrate 23 is removed not by machining but by peeling off along the peeling layer. Then, the process of manufacturing a semiconductor device can be realized at low cost.

Figure 13A:
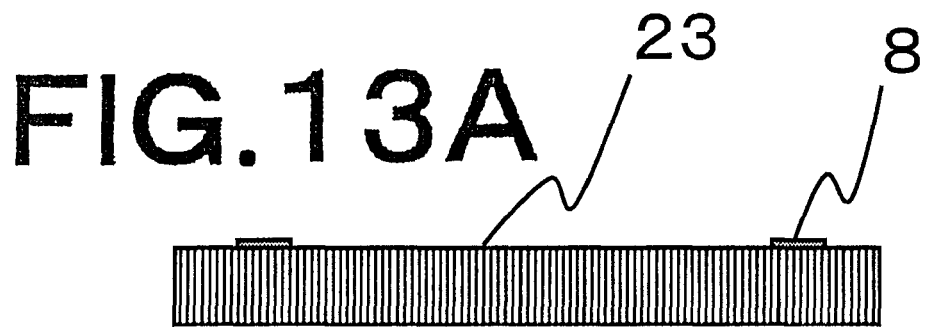
Figure 13B:
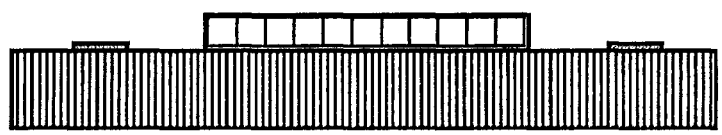
Figure 13C:
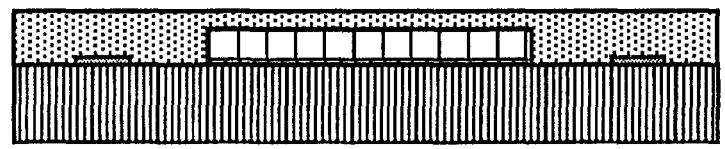

FIGS. 13A through 13F schematically illustrate a method of manufacturing a semiconductor device by which the vias 7 are filled with metal. A desired semiconductor device can be produced by adding an operation of filling the vias 7 with metal as shown in FIG. 13D to the step in FIG. 12D.

Second Embodiment

Figure 3:
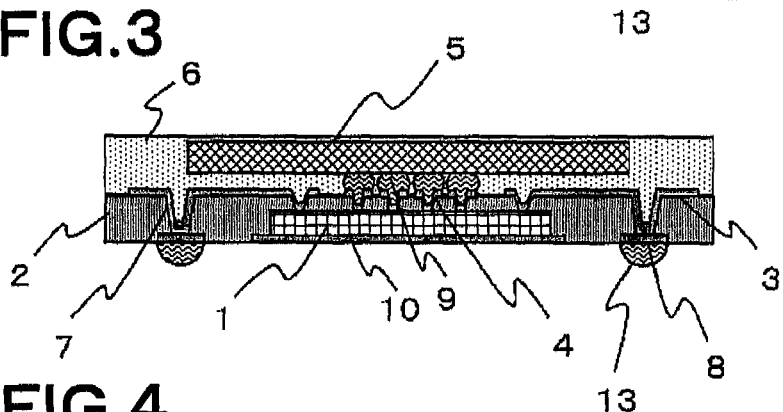
FIG. 3 is a schematic cross sectional view of a second embodiment of the semiconductor device according to the present invention.

FIG. 3 schematically illustrates the second embodiment of the present invention. This embodiment differs from the first embodiment in that the metal plate 10 is fitted to the surface (lower surface) opposite to the circuit surface of the first semiconductor element 1 and hence at the side where the external connection terminals 8 are arranged. The metal plate 10 is buried at least at a part of the lateral surface thereof in the first insulating material 2.

This embodiment is characterized in that the first semiconductor element 1 is mounted on the metal plate 10 so that the metal plate 10 operates as a cap structure and functions as a barrier to moisture absorption from the bottom surface (lower surface) of the first semiconductor element 1 to raise the heat emission characteristic of the device. Additionally, the metal plate 10 operates as reinforce for the gap between the insulating material 2 and the lateral surface of the semiconductor element 1.

This embodiment also provides a manufacturing advantage that the metal plate 10 can improve the accuracy of mounting the first semiconductor element 1 and hence a high precision level is not required for the wiring technique for connecting the external connection terminals 8 and the first semiconductor element 1 to each other by way of the wires 3.

Additionally, the metal plate 10 is arranged with the external connection terminals 8 on the same surface simultaneously so that the relative dimensional accuracy of the device can be improved. More specifically, the metal plate 10 can be used as a base for positioning, whereby no misalignment takes place when a number of devices are collectively processed with use of a mask for exposure/development in plating or for printing, to form wires 3 in an upper layer. Then, the manufacturing yield factor can be improved and micro-wiring rules become applicable.

Figure 4:
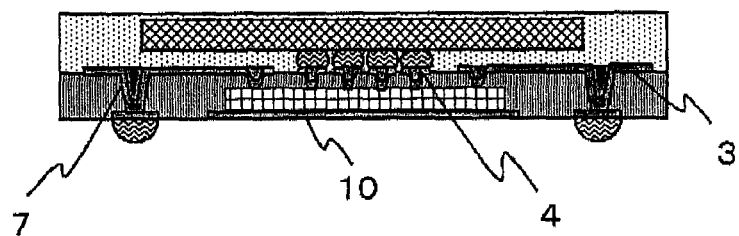
FIG. 4 is a schematic cross sectional view of the second embodiment of the semiconductor device according to the present invention.

While the vias 7 are not filled with metal in FIG. 3, a via 7 that is filled with metal as shown in FIG. 4 may be used with an unfilled via in combination. Any possible generation of voids can be suppressed when sealing the vias 7 with an insulating material 6 provided that the vias 7 are filled with metal. While a single layer of wires 3 is formed in this embodiment, the wiring density can be improved when a filled via 7 is appropriately combined with an unfilled via 7. The advantage of such a combination can be optimally exploited when each of the wires 3 is formed as a multilayer.

Now the method of manufacturing the semiconductor device of the second embodiment will be described by referring to FIGS. 14A through 14F.

Figure 14A:
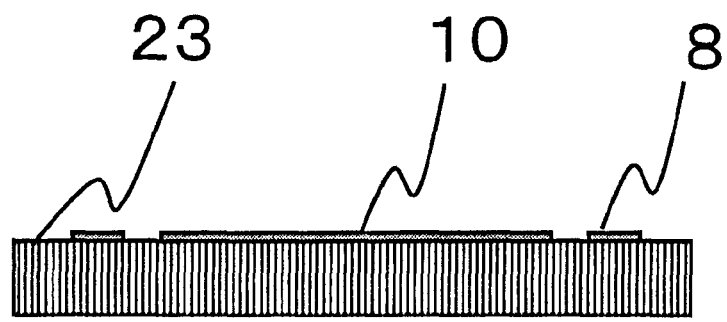
FIGS. 14A through 14F are process diagrams showing the method of manufacturing the semiconductor device of the second embodiment according to the present invention.
Figure 14B:
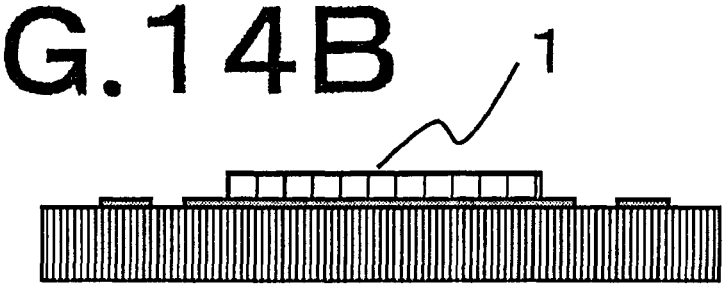
Figure 14C:
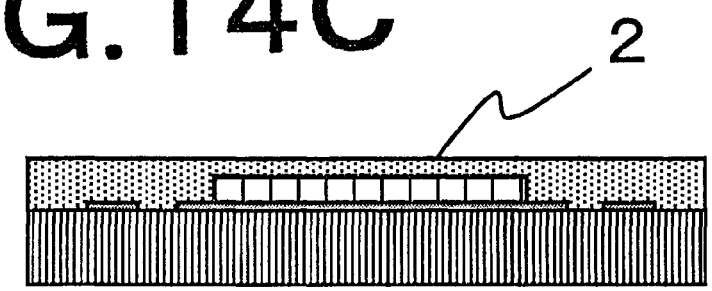
Figure 14D:
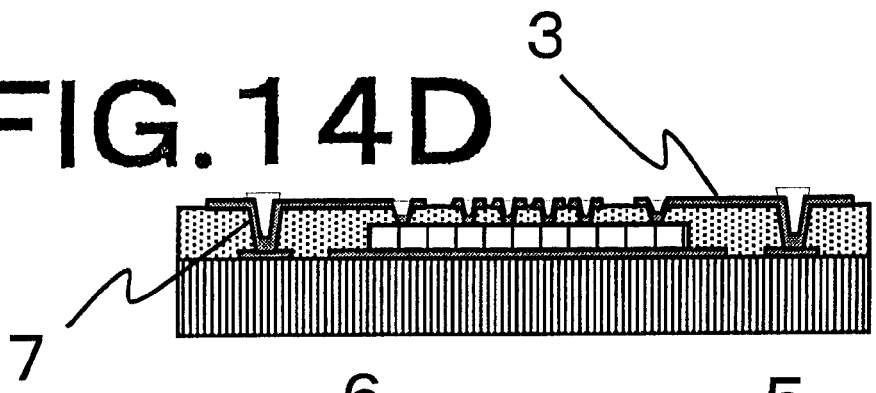
Figure 14E:
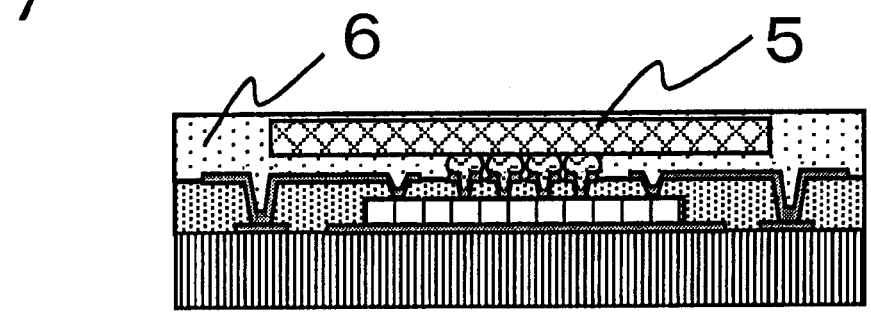
Figure 14F:
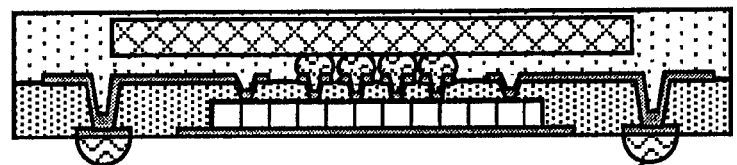

This manufacturing method is characterized in that external connection terminals 8 and a metal plate 10 are firstly formed on a support substrate 23 (FIG. 14Aa). In other words, with this embodiment, the metal plate 10 is formed in a region different from the regions for forming the external connection terminals 8 on the support substrate 23 in the step of forming the external connection terminals 8 on the support substrate 23. The metal plate 10 is arranged with the external connection terminals 8 on the same surface simultaneously so that the first semiconductor element 1 can be mounted with a high positional accuracy relative to the external connection terminals 8. The steps of FIGS. 14B through 14F are substantially the same as those of FIGS. 12B through 12F.

Figure 15A:
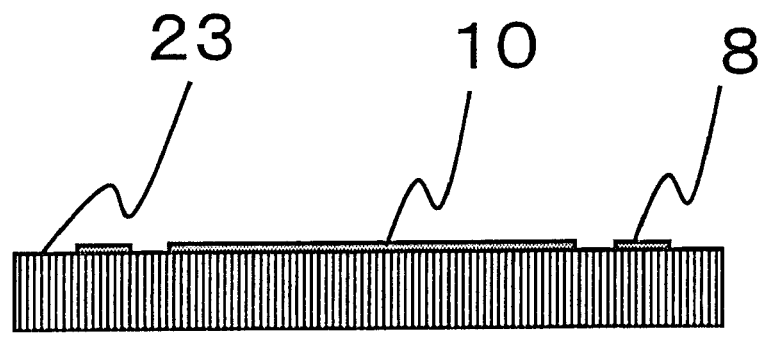
Figure 15B:
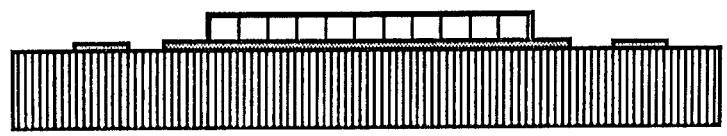
Figure 15C:
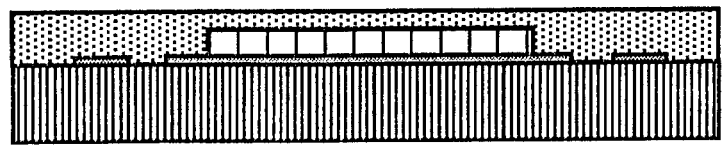

FIGS. 15A through 15F schematically illustrate a method of manufacturing a semiconductor device by which the vias 7 are filled with metal. A desired semiconductor device can be produced by adding an operation of filling the vias 7 with metal as shown in FIG. 15D to the step in FIG. 14D.

Third Embodiment

Figure 5:
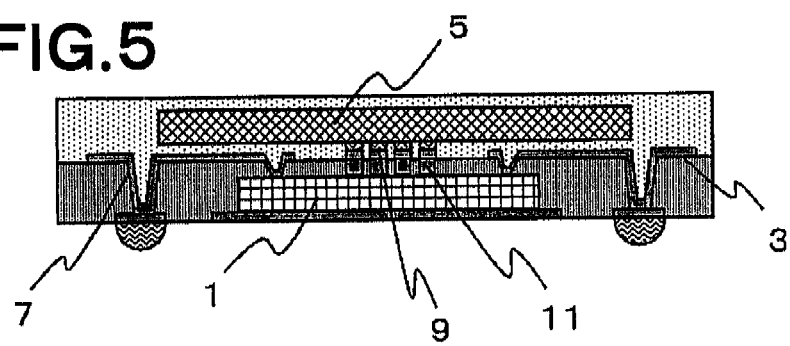
FIG. 5 is a schematic cross sectional view of a third embodiment of the semiconductor device according to the present invention.

FIG. 5 schematically illustrates the third embodiment of the present invention. This embodiment differs from the second embodiment in that metal projections 11 are formed on the circuit surface of the first semiconductor element 1 and the first semiconductor element 1 and the second semiconductor element 5 are connected to each other by way of the metal projections 11 in this embodiment. In other words, in the present embodiment, the metal projections 11 fitted to the first semiconductor element 1 operate as the connection electrode.

Figure 6:
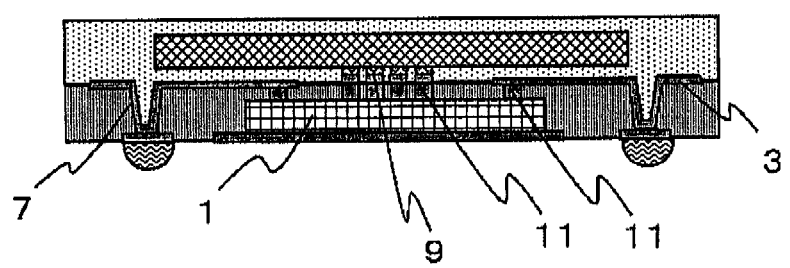
FIG. 6 is a schematic cross sectional view of the third embodiment of the semiconductor device according to the present invention.

In the modified embodiment illustrated in FIG. 6, the first semiconductor element 1 and the wires 3 are also connected by way of additional metal projections 11. In other words, in the present embodiment, the conducting members include the additional metal projections 11 fitted to the first semiconductor element 1, the wire 3 arranged along the interface of the first insulating material 2 and the second insulating material 6, and the vias 7 buried in the first insulating material 2.

Now, the method of manufacturing the semiconductor device of the third embodiment will be described by referring to FIGS. 16A through 16F.

Figure 16A:
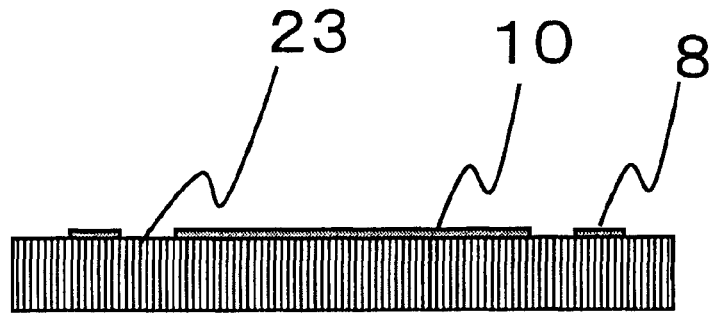
FIGS. 16A through 16F are process diagrams showing the method of manufacturing the semiconductor device of the third embodiment according to the present invention.
Figure 16B:
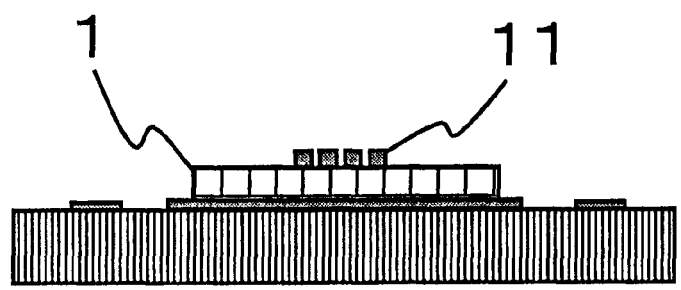
Figure 16C:
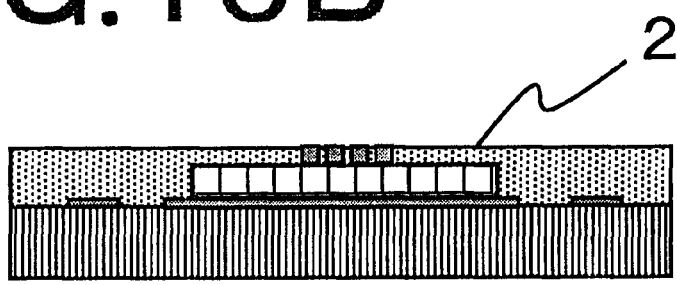
Figure 16D:
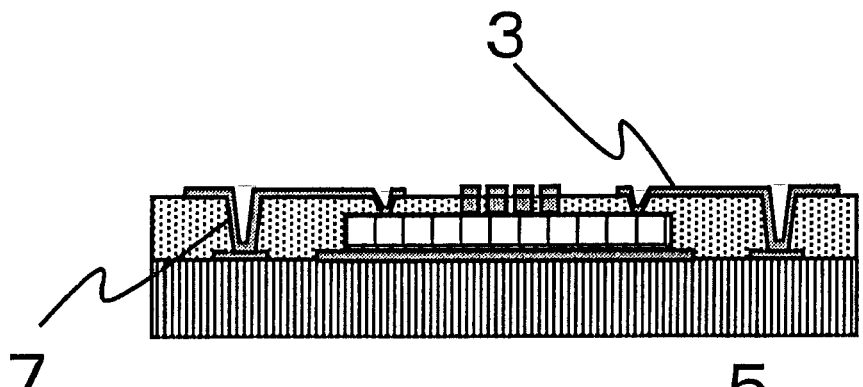

Firstly, external connection terminals 8 and a metal plate 10 are formed on a support substrate 23 by plating (FIG. 16A). Then, a first semiconductor element 1 is mounted to face up so as to provide a high positional accuracy relative to the external connection terminals 8. Metal projections 11 are formed in advance on the first semiconductor element 1 to be mounted so as to operate as electrode [connection electrode] to be connected to a second semiconductor element 5 (FIG. 16B). After coating the entire structure formed on the support substrate 23 with a first insulating material 2, the metal projections 11 are exposed (FIG. 16C). Thereafter, holes are made through the first insulating material 2 at positions corresponding to the external connection terminals 8 and connecting parts (electrodes) on the first semiconductor element 1, and wires 3 and vias 7 are formed there by plating (FIG. 16D). A plating film may be formed on the top surfaces of the metal projections 11 by plating.

Thus, in this embodiment, metal projections 11 are fitted to the circuit surface of the first semiconductor element 1 in advance, and the surfaces of the metal projections 11 are exposed after the step of burying them by the first insulating material 2. Then, the metal projections 11 are used as connection electrode for electrically connecting the second semiconductor element 5 and the first semiconductor element 1 to each other in a subsequent step.

The operation of exposing the metal projections 11, and exposing the electrodes of the first semiconductor element 1 and external connection terminals 8 located at the predetermined positions in the first insulating material 2 can vary depending on the characteristics of the first insulating material 2. Photolithography may be used when photosensitive resin is used for the first insulating material 2, while a technique of removing resin by means of a laser may be used when non-photosensitive thermosetting resin or thermoplastic resin is used for the first insulating material 2.

Figure 16E:
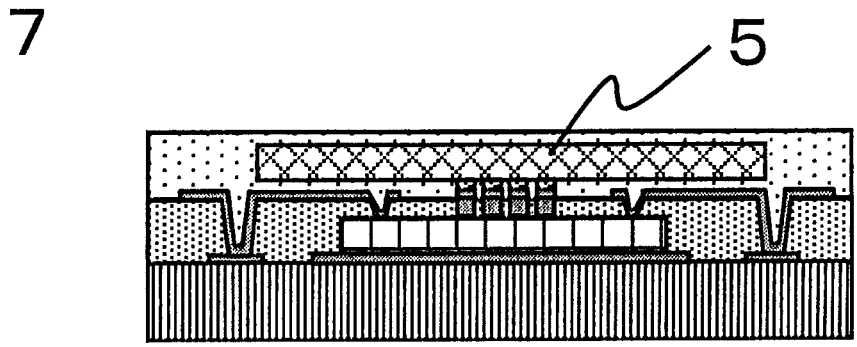
Figure 16F:
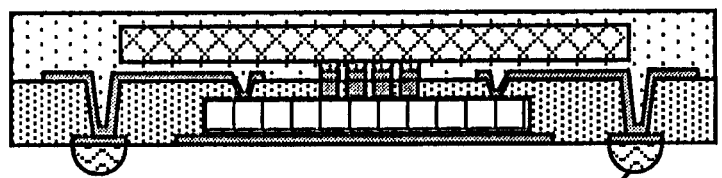

The steps of FIGS. 16E and 16F are substantially the same as those of FIGS. 12E and 12F.

The yield factor of the wire forming step can be improved when metal projections 11 are formed on the first semiconductor element 1 as connection electrode for electrically connecting the first and second semiconductor elements to each other. Then, the semiconductor device can be manufactured at low cost.

Additionally, the metal plate 10 is arranged with the external connection terminals 8 on the same surface simultaneously so that the first semiconductor element 1 can be mounted with a high level of positional accuracy relative to the external connection terminals 8. As the positional accuracy of mounting the semiconductor element 1 is improved relative to the external connection terminals 8, this method provides an advantage that a micro pattern can be applied to a manufacturing process where an entire wafer is exposed to light at a time in a wire forming step.

FIGS. 17A through 17F schematically illustrate the method of manufacturing the modified embodiment of FIG. 6. This method differs from the method of FIGS. 16A through 16F only in terms of the pattern of the metal projections 11 formed on the circuit surface of the first semiconductor element 1. This manufacturing method is characterized in that it does not need to form micro vias 7 as shown in FIG. 16D for connecting the first semiconductor element 1 and the wires 3.

Figure 17A:
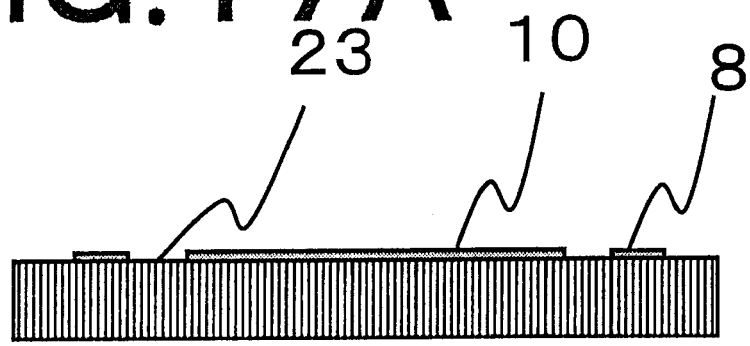
Figure 17B:
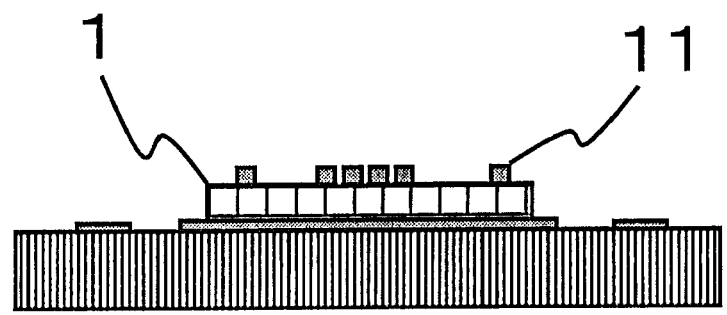
Figure 17C:
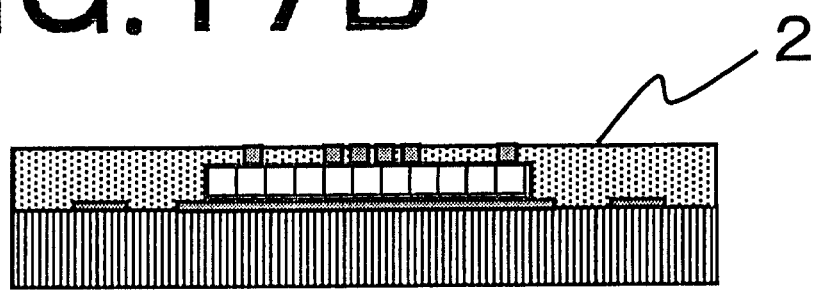

With the manufacturing method of FIGS. 16A through 16F, the depth of the vias 7 formed on the external connection terminals 8 and the vias 7 formed on the first semiconductor element 1 differ from each other to a large extent to remarkably reduce the processability. More specifically, when the extent of exposure to light is adjusted in the photolithography step to make it match the deep holes, the shallow holes are made to show a large diameter against any efforts for micronization. On the other hand, when the extent of exposure to light is adjusted to make it match the shallow holes, the deep holes cannot be made satisfactorily deep. The above pointed out problem also takes place when a laser is used to make holes. This problem can be avoided by forming metal projections 11 for all the electrodes of the first semiconductor element 1 as shown in FIG. 17B.

Fourth Embodiment

Figure 7:
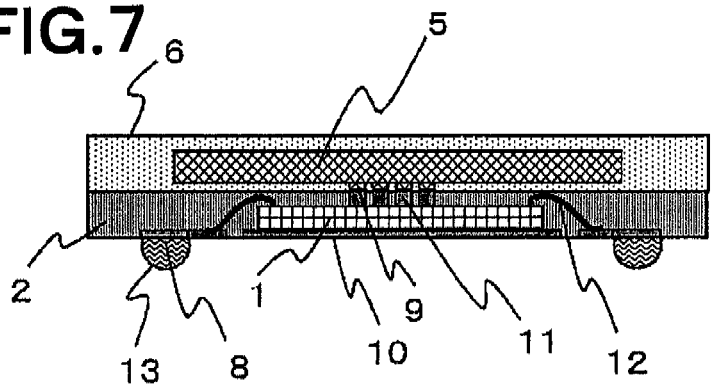
FIG. 7 is a schematic cross sectional view of a fourth embodiment of the semiconductor device according to the present invention.

FIG. 7 is a schematic illustration of the fourth embodiment of the present invention. This embodiment differs from the third embodiment in that the external connection terminals 8 and the first semiconductor element 1 are connected to each other by way of bonding wires 12. More specifically, the conducting members of this embodiment include the bonding wires 12 buried in the first insulating material 2. The metal projections 11 for connecting the first semiconductor element 1 and the second semiconductor element 5 to each other are formed on the circuit surface of the first semiconductor element 1, and the first semiconductor element 1 and the second semiconductor element 5 are connected to each other with their circuit surfaces facing each other by way of bumps 9. The connecting sections including the bumps 9 are sealed by the second insulating material 6.

The connection utilizing bonding wires 12 is flexible if the mounting positions of the related components are not highly accurate and can use appropriate parts of the components so that the assembling process can be executed efficiently at low cost. Additionally, the wire bonding process can be realized at a remarkably low cost if compared with a plating process. Furthermore, since the step of connecting the external connection terminals 8 and the first semiconductor element 1 to each other can enjoy a high degree of freedom of connection, it does not require a chip mounter showing a high degree of mounting accuracy for the purpose of mounting a semiconductor element. Thus, the manufacturing time and the manufacturing cost can be remarkably reduced with this manufacturing method.

When the electrode of the first semiconductor element 1 to be connected to the external connection terminal 8 is micronized and hence requires a high degree of accuracy in the wire forming step, the degree of freedom of connection can be greatly raised by utilizing wire bonding for the connection.

As pointed out above, the operation of mounting a semiconductor element does not require a chip mounter showing a high degree of mounting accuracy with the structure, where the first semiconductor element 1 is mounted on the metal plate 10 formed on the same surface as the surface carrying the external connection terminals 8 and the first semiconductor element 1 and the external connection terminals 8 are connected to each other by way of wire bonding, because the degree of freedom of connection is remarkably raised in the step of connecting the external connection terminals 8 and the first semiconductor element 1 to each other. Thus, the manufacturing time and the manufacturing cost can be remarkably reduced with this manufacturing method.

While the fourth embodiment shown in FIG. 7 is characterized in that the step of connecting the external connection terminals 8 to the first semiconductor element 1 is simplified because they are connected to each other by bonding wires 12, the external connection terminals 8 and the metal plate 10 are exposed at the surfaces that are on the same level in the manufacturing process. Therefore, when the external connection terminals 8 are arranged at a low pitch, it is preferable to add a step of protecting the surfaces by means of a protection film that is typically made of popular solder resist to the manufacturing process in order to secure a high degree of reliability against electro-migrations, etc.

Figure 18D:
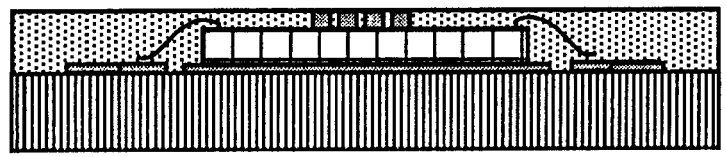
Figure 18E:
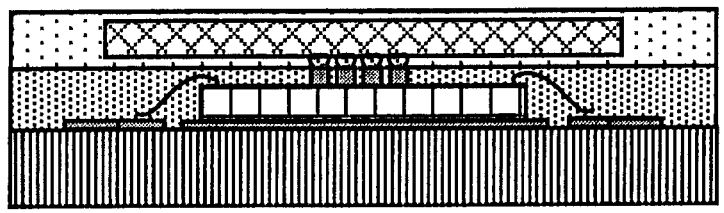
Figure 18F:
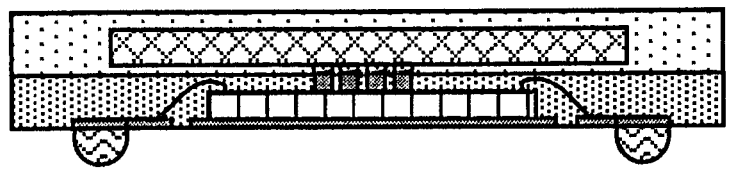

Now, the method of manufacturing the semiconductor device of the fourth embodiment will be described by referring to FIGS. 18A through 18F. This method differs from the manufacturing method shown in FIGS. 16A through 16F in that the external connection terminals 8 and the first semiconductor element 1 are connected to each other by means of bonding wires 12 after the step of FIG. 18B that is similar to the step of FIG. 16B and subsequently the first insulating material 2 is arranged as shown in FIG. 18C and the metal projections 11 are exposed as shown in FIG. 18D. Neither vias 7 nor wires 3 are formed with this method unlike in FIG. 16D. The steps of FIGS. 18E and 18F are substantially the same as those of FIGS. 16E and 16F.

Thus, the method of manufacturing a semiconductor device of this embodiment comprises:

a step of forming the external connection terminals 8 and a metal plate 10 on a support substrate 23;

a step of arranging the first semiconductor element 1 so as to face up on the metal plate 10;

a step of forming bonding wires 12 for electrically connecting the first semiconductor element 1 and the external connection terminals 8 to each other;

a step of burying at least a part of the lateral surface of the first semiconductor element 1, the external connection terminals 8, and the bonding wires 12 in the first insulating material 2;

a step of connecting the second semiconductor element 5, by making it face down, to the first semiconductor element 1 by way of the metal projections 11 each operating as connection electrode;

a step of covering at least the circuit surface of the second semiconductor element 5 by means of the second insulating material 6; and a step of removing the support substrate 23.

Fifth Embodiment

Figure 8:
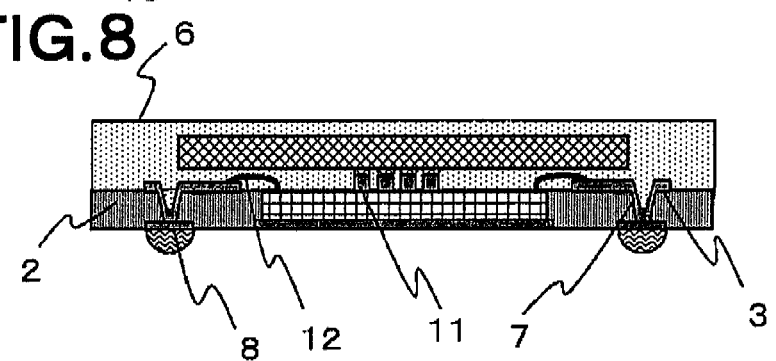
FIG. 8 is a schematic cross sectional view of a fifth embodiment of the semiconductor device according to the present invention.

FIG. 8 is a schematic illustration of the fifth embodiment of the present invention. In this embodiment, the wires 3 are formed independently from the first semiconductor element 1 and connected to the external connection terminals 8 by way of vias 7. The first semiconductor element 1 and the wires 3 are connected to each other by way of bonding wires 12 buried in the second insulating material 6.

In this embodiment, the insulating layer is formed by at least a part of the second insulating material 6. The conducting members include the bonding wires 12 buried in the second insulating material 6, wires 3 arranged along the interface of the first insulating material 2 and the second insulating material 6, and vias 7 buried in the first insulating material 2. With this arrangement, a high reliability of the device can be achieved without adding a solder resist forming step to the method of manufacturing the device.

FIGS. 19A through 19F schematically illustrate a method of manufacturing the embodiment of FIG. 8.

Firstly, external connection terminals 8 and a metal plate 10 are formed on a support substrate 23 by plating (FIG. 19A). Then, a first semiconductor element 1 is mounted on the metal plate 10 to face up so as to provide a high positional accuracy relative to the external connection terminals 8 (FIG. 19B). Metal projections 11 are formed in advance on the first semiconductor element 1 at positions to be connected to a second semiconductor element 5. Then, a first insulating material 2 is arranged on the structure formed on the support substrate 23 in the entire area thereof except the circuit surface of the first semiconductor element 1 and the metal projections 11 (FIG. 19C). Thereafter, holes are made through the first insulating material 2 at parts above the external connection terminals 8, and wires 3 and vias 7 are formed by plating. Subsequently, the wires 3 and the first semiconductor element 1 are connected to each other by bonding wires 12 (FIG. 19D). In other words, after the step of forming the wires 3 and the vias 7 in the first insulating material 2 as at least a part of the conducting members, bonding wires 12 for electrically connecting the wires 3 to the first semiconductor element 1 to each other are formed as at least a part of the conducting members. Then, a second semiconductor element 5 associated with solder bumps formed thereon is mounted to face down, and the gap between the second semiconductor element 5 and wires 3 is filled with a second insulating material 6 to bury the bonding wires 12, while the exposed parts of the first insulating material 2, wires 3 and second semiconductor element 5 are covered also by the second insulating material 6 to consequently cover the entire structure formed on the support substrate 23 (FIG. 19E).

Thereafter, the support substrate 23 is removed to expose the external connection terminals 8. Subsequently, solder bumps are formed by external connection solders 13 and the device is diced to complete the manufacturing process (FIG. 19F).

The support substrate 23 is preferably made of a material that provides it with characteristics including an excellent degree of flatness and a thermal expansion coefficient that makes it free from deformations due to thermal expansion and other causes and is equal to or close to the thermal expansion coefficient of the first semiconductor element 1 and that of the second semiconductor element 5. With the above-described embodiment, all the manufacturing process is conducted with the support substrate fitted to the device. Then, the operation of forming the external connection terminals 8, metal plate 10 and wires 3, that of mounting the first semiconductor element 1 and that of mounting the second semiconductor element 5 can be carried out to a high degree of precision by using such a support substrate 23. The step of forming vias 7 in the first insulating material 2 can be carried out collectively over a large number of semiconductor devices by photolithography when a photosensitive resin material is selected for the first insulating material 2. Therefore, the manufacturing process is made highly efficient.

Other techniques that can be used for forming the wires 3 include sputtering, vapor deposition, paste printing and ink jet (paste) printing.

While the metal projections 11 are formed on the first semiconductor element 1 in advance in the above description, the metal projections 11 may alternatively and collectively formed in the step of forming the wires 3. If such is the case, it is preferable to consider the height of the loops of the bonding wires 12 so as to use material or process which is advantageous in achieving a low profile loop or use a technique of raising the height of the bumps formed on the second semiconductor element 5.

The entire support substrate 23 can be collectively processed by photolithography in the step of forming vias 7 in the first insulating material 2 when a photosensitive resin material is used for the first insulating material 2, to thereby make the manufacturing process highly efficient. The first semiconductor element 1 can be mounted so as to provide a high positional accuracy relative to the external connection terminals 8 when the metal plate 10 is formed simultaneously with the external connection terminals 8 on the same surface.

A technique such as grinding or etching that is being applied to semiconductor device manufacturing processes can be used for removing the support substrate 23. The support substrate 23 is made reusable when a peeling layer is formed on the support substrate 23 in advance and the support substrate 23 is removed not by machining but by peeling off along the peeling layer. Then, the process of manufacturing a semiconductor device can be realized at low cost.

Sixth Embodiment

Figure 9:
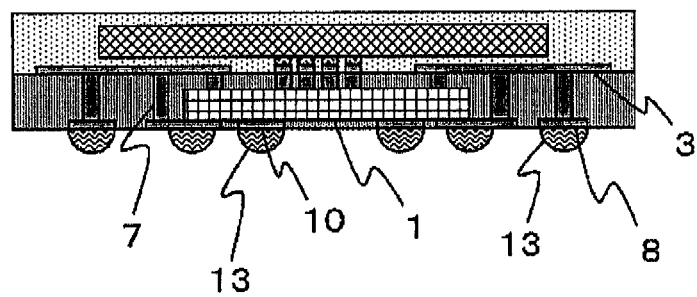
FIG. 9 is a schematic cross sectional view of a sixth embodiment of the semiconductor device according to the present invention.

FIG. 9 schematically illustrates an embodiment where the metal plate 10 is processed into terminals like the external connection terminals 8 so as to form the external connection solders 13 thereon. The heat emission characteristics of the device can be further improved by such an arrangement. Beside the heat emitting effect, external connection solders 13 can be arranged on the bottom surface of the first semiconductor element 1 when they are electrically connected to the first semiconductor element 1 by way of vias 7 and wires 3 to flexibly accommodate a multi-pin arrangement. The metal plate 10 operates also as wiring layer in this embodiment.

Seventh Embodiment

Figure 10:
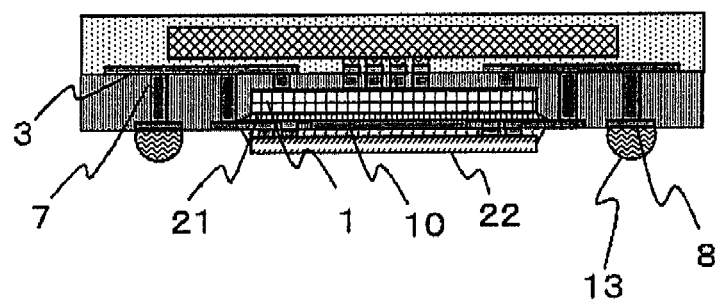
FIG. 10 is a schematic cross sectional view of a seventh embodiment of the semiconductor device according to the present invention.

While two semiconductor elements are connected to each other in each of the above-described embodiments, a third semiconductor element 22 can be connected to the metal plate 10 as shown in FIG. 10. In this case, the metal plate 10 is processed so as to produce external connection terminals 8 on which external connection solders 13 can be formed or to realize electrode dimensions that allow the third semiconductor element to be connected to it and then connected to the first semiconductor element 1 by way of vias 7 and wires 3. Thus, the device is a multi-chip package having three semiconductor elements.

Eighth Embodiment

Figure 11:
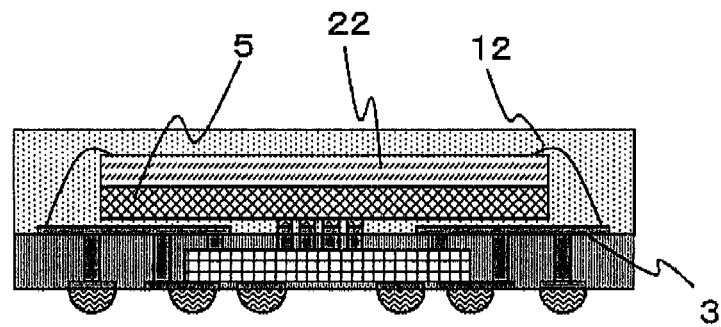
FIG. 11 is a schematic cross sectional view of an eighth embodiment of the semiconductor device according to the present invention.

FIG. 11 schematically illustrates a semiconductor device where a third semiconductor element 22 is mounted on the second semiconductor element 5 so as to face up. This arrangement makes it ease to produce a multi-chip package by connecting the third semiconductor element 22 to the wires 3 by wire bonding.

While all the connecting parts are sealed by the second insulating material 6 in each of the above-described embodiments, they may alternatively be sealed by resins of two different types. The gap between the wires 3 and the second semiconductor element 5 is very narrow so that it may be filled with an underfill resin material showing a high filling effect and high fluidity and subsequently the second insulating material 6 may be applied as overcoat to protect the entire device.

As for the method of manufacturing this embodiment, any of the manufacturing steps may appropriately be switched or replaced by some other step. In other words, an optimum manufacturing process may selectively be used from the viewpoint of positional accuracy, wiring rules and cost.

EXAMPLES

Example 1

A silicon wafer is brought in as a support substrate 23 and a film was formed on it by plating. The plated film is then processed by etching to produce lands for external connection terminals 8. For each semiconductor device, a 50 micrometers thick first semiconductor element 1 was mounted on the support substrate 23 to face up and bonded by means of a thermosetting adhesive, using the external connection terminals 8 as reference for determining the mounting position of the semiconductor element 1.

A predetermined number of first semiconductor devices 1 are mounted on the silicon wafer and a photosensitive first insulating material 2 is applied thereto. A via-forming mask having openings at positions for forming vias 7 and connection electrodes 4 to be used for electrically connecting the first semiconductor elements 1 to the corresponding second semiconductor elements 5 is prepared, and the first insulating material 2 is processed to show openings at the predetermined positions by means of exposure and development. After forming the openings, copper are plated as material for forming wires 3 for electrically connecting the external connection terminals 8 and the first semiconductor elements 1. Then, resist is applied to the plated copper film, and the wires 3 are formed by etching the plated copper film, using the mask prepared by exposing the resist to light and developing it. Nickel that is a metal for prevention of diffusion and gold that is an anti-oxidant metal may be deposited at the positions of the connection electrodes 4 because a solder bonding operation takes place there. The thickness of the first semiconductor elements 1 can be reduced by appropriately selecting a first insulating material 2 that can maintain a certain degree of mechanical strength. The thickness is preferably between 10 and 20 μm from the viewpoint of forming vias, whereas it is preferably about 100 to 500 micrometers from the viewpoint of mechanical strength. The thickness is to be adjusted appropriately according to the selected material.

When the process is carried on without etching the seed metal for feeding power for the plating that is used when forming the external connection terminals 8, it is not necessary to provide new seed metal for forming wires 3. In other words, the seed metal for forming the external connection terminals 8 can be used for the plating for forming the wires 3 to simplify the process.

Then, second semiconductor elements 5 that are associated with solder bumps are prepared and mounted to face down by means of a flip chip mounter. The gaps between the wires 3 and second semiconductor elements 5 are filled with underfill resin, which is then set. Subsequently, the devices are collectively molded by compression molding, using a second insulating material 6. The silicon wafer that operates as support substrate 23 is removed when the molded resin can support the devices. The support substrate 23 is removed by means of a combination of grinding and etching until the external connection terminals 8 become exposed. Since solder bumps are employed as solder for external connections, diffusion preventing nickel and anti-oxidant gold may be deposited on the solder mounting surfaces of the external connection terminals 8.

As for the resin to be filled in the gaps between the second semiconductor elements 5 and wires 3, the gaps can be filled collectively by compression molding without using underfill resin when the second insulating material 6 is very high in fluidity.

Subsequently, external connection solders are formed by mounting solder balls or by printing solder paste. Then, all the process is completed by dicing to produce individual devices.

While photosensitive resin is used for the first insulating material 2 in the above description, non-photosensitive resin may alternatively be used and vias may be formed by way of a laser process for the purpose of the present invention.

Example 2

A metal plate 10 is arranged with external connection terminals 8 on the same surface at the position where a first semiconductor element 1 is mounted. The metal plate 10 provides in combination an effect of improving the positioning of the first semiconductor element 1, an effect of preventing the semiconductor element from absorbing moisture and an effect of raising the emission of heat of the semiconductor element. While a thermosetting adhesive agent is used when the first semiconductor element 1 is mounted on the metal plate 10, a conductive adhesive agent containing metal powder may be used to raise the effect of the emission of heat of the semiconductor element.

Example 3

When the process of forming metal projections 11 on the first semiconductor element 1 in advance in the area corresponding to the connection electrode 4 is employed, the first insulating material 2 supplied is ground until the metal projections 11 become exposed.

Example 4

When the external connection terminals 8 and the first semiconductor element 1 are connected to each other by bonding wires 12, a metal that improves the bonding effect is preferably deposited on the surfaces of the copper wires 3.

The steps of any of the above-described examples may be recombined appropriately.

While the invention has been particularly shown and described with reference to exemplary embodiments and examples thereof, the inventions is not limited to these embodiments and examples. It will be understand by those of ordinary skill in the art that various changes in form and details may be made without departing from the spirit and scope of the present invention as defined by the claims.

This application is based upon and claims the benefit of priority from Japanese patent application No. 2007-92462, filed on Mar. 30, 2007, the disclosure of which is incorporated herein in its entirety by reference.

What is claimed is:

1. A semiconductor device having a first semiconductor element and a second semiconductor element with their respective circuit surface sides located vis-à-vis relative to each other;
    the first semiconductor element being buried at least at a part of the lateral surface thereof in a first insulating material;
    the second semiconductor element being covered at least at the circuit surface thereof by a second insulating material;
    a connection electrode being buried in a first region of an insulating layer arranged between the circuit surface of the first semiconductor element and the circuit surface of the second semiconductor element, the insulating layer including at least a part of the second insulating material;
    an external connection terminal being arranged on the surface of the first insulating material facing in the same direction as the surface of the first semiconductor element opposite to the circuit surface thereof;
    the connection electrode forming at least a part of a path for electrically connecting the circuit surface of the first semiconductor element and the circuit surface of the second semiconductor element to each other;
    the first semiconductor element and the external connection terminal being electrically connected to each other by way of a conducting member passing through a second region of the insulating layer distinct from said first region;
    wherein the conducting member includes a wire arranged along the interface of the first insulating material and the second insulating material, a bonding wire buried in the second insulating material and connected to an end of the wire, and a via buried in the first insulating material and connected to the other end of the wire,
    the bonding wire having an end connected to the circuit surface of the first semiconductor element and the other end connected to the end of the wire, and the via being connected to the external connection terminal, and
    wherein the surface of the first insulating material facing in the same direction as the surface of the first semiconductor element opposite to the circuit surface thereof is flat.

2. The semiconductor device as set forth in claim 1, wherein the via is filled with metal.

3. The semiconductor device as set forth in claim 1, wherein a metal plate is fitted to the surface of the first semiconductor element opposite to the circuit surface thereof.

4. The semiconductor device as set forth in claim 1, wherein the surface of the first insulating material on which the external connection terminal is arranged is positioned lower than the circuit surface of the first semiconductor element.

5. The semiconductor device as set forth in claim 1, wherein an external connection solder is arranged on the external connection terminal, and the external connection terminal is positioned lower than the circuit surface of the first semiconductor element.

* * * * *